(12) United States Patent
Khachatryan (10) Patent No.: US 9,178,167 B2
(45) Date of Patent: Nov. 3, 2015

(54) METHOD OF MANUFACTURING FLEXIBLE DISPLAY APPARATUS

(71) Applicant: Samsung Display Co., Ltd., Gyeonggi-do (KR)

(72) Inventor: Hayk Khachatryan, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 22 days.

(21) Appl. No.: 14/020,152

(22) Filed: Sep. 6, 2013

(65) Prior Publication Data

US 2014/0315463 A1    Oct. 23, 2014

(30) Foreign Application Priority Data

Apr. 17, 2013 (KR) .................. 10-2013-0042422

(51) Int. Cl.
*H05B 33/10*    (2006.01)
*H01L 51/00*    (2006.01)
*G06F 1/16*    (2006.01)

(52) U.S. Cl.
CPC .......... *H01L 51/0097* (2013.01); *G06F 1/1652* (2013.01); *H01L 51/003* (2013.01); *H01L 2227/326* (2013.01); *H01L 2251/5338* (2013.01); *Y02E 10/549* (2013.01)

(58) Field of Classification Search
CPC ............ H01L 51/0016; H01L 21/67265; H01L 21/673; H01L 21/67303; H01L 21/67313; H01L 21/6732; H01L 21/67326–21/6733; H01L 21/6735; H01L 21/67353; H01L 21/67366; H01L 21/677; H01L 21/7688; H01L 21/0331; H01L 21/7813; H01L 2227/326; H01L 21/6835; H01L 2221/6835; H01L 2221/68381; H01L 2221/68359; H01L 2221/68363; H01L 2251/5338; H01L 51/003; H01L 51/0097; H01L 31/0236; H01L 31/18; H01L 31/1892; G06F 1/1652; Y02E 10/549
USPC .................. 445/24.25, 24–25; 313/498–512; 174/254; 156/247, 230; 438/455, 458
See application file for complete search history.

(56) References Cited

U.S. PATENT DOCUMENTS

| | | | |
|---|---|---|---|
| 5,411,563 | A | 5/1995 | Yeh et al. |
| 6,407,764 | B1 * | 6/2002 | Susukida et al. .............. 347/209 |
| 7,308,317 | B1 * | 12/2007 | Okandan et al. .............. 607/115 |
| 8,034,206 | B2 | 10/2011 | Kim et al. |
| 8,877,619 | B1 * | 11/2014 | Thompson et al. ........... 438/527 |
| 2004/0053449 | A1 * | 3/2004 | Chang et al. .................. 438/149 |
| 2007/0002266 | A1 | 1/2007 | Seo et al. |

(Continued)

FOREIGN PATENT DOCUMENTS

| | | |
|---|---|---|
| KR | 10-2007-0002165 | 1/2007 |
| KR | 10-2009-0114195 | 11/2009 |
| KR | 10-2012-0006844 | 1/2012 |

OTHER PUBLICATIONS

Romashin et al., Properties of Fused Silica Ceramic, Ogneupory, No. 9, pp. 58-63, Sep. 1968.*

Primary Examiner — Anne Hines
Assistant Examiner — Jose M Diaz
(74) Attorney, Agent, or Firm — Lee & Morse, P.C.

(57) ABSTRACT

A method of manufacturing a flexible display apparatus, the method includes bonding a substrate onto a porous carrier substrate; forming a light-emitting display unit on the substrate; forming an encapsulating layer on the light-emitting display unit; and removing the porous carrier substrate.

17 Claims, 6 Drawing Sheets

(56) References Cited

U.S. PATENT DOCUMENTS

| | | | |
|---|---|---|---|
| 2009/0261062 A1* | 10/2009 | Kim | 216/24 |
| 2010/0051178 A1* | 3/2010 | Lee et al. | 156/152 |
| 2011/0204361 A1* | 8/2011 | Nishiki et al. | 257/52 |
| 2013/0071999 A1* | 3/2013 | Cheng et al. | 438/478 |
| 2013/0105203 A1 | 5/2013 | Lee et al. | |
| 2013/0140838 A1* | 6/2013 | Wang et al. | 294/188 |
| 2014/0065389 A1* | 3/2014 | Loy et al. | 428/214 |
| 2014/0065393 A1* | 3/2014 | Lee et al. | 428/216 |

\* cited by examiner

METHOD OF MANUFACTURING FLEXIBLE DISPLAY APPARATUS

CROSS-REFERENCE TO RELATED APPLICATION

Korean Patent Application No. 10-2013-0042422 filed on Apr. 17, 2013, in the Korean Intellectual Property Office, and entitled: "METHOD OF MANUFACTURING FLEXIBLE DISPLAY APPARATUS," is incorporated by reference herein in its entirety.

BACKGROUND

1. Field

Embodiments relate to a method of manufacturing a flexible display apparatus.

2. Description of the Related Art

Recently, with the development of display technology, flexible display apparatuses that may be folded or rolled are under research and being developed.

Organic light-emitting display panels provide high-quality features such as wide viewing angles, high contrast ratio, quick response time, low power consumption, and the like. Therefore, organic light-emitting display panels may be applied to personal portable devices such as MP3 players or cellular phones, televisions, and more. Also, since organic light-emitting display panels are self-emissive and do not require a separate light source, thicknesses and weights of organic light-emitting display panels may be reduced.

Organic light-emitting display panels may be embodied as flexible display panels using a plastic substrate. In general, flexible organic light-emitting display panels may be formed by forming an organic light-emitting device, and the like on a carrier substrate formed of a material such as glass, and then removing the carrier substrate from a plastic substrate.

SUMMARY

Embodiments are directed to a method of manufacturing a flexible display apparatus including bonding a substrate onto a porous carrier substrate; forming a light-emitting display unit on the substrate; forming an encapsulating layer on the light-emitting display unit; and removing the porous carrier substrate.

The method may further include forming a fixing unit that fixes the substrate onto the porous carrier substrate.

The fixing unit may be partially formed along a boundary of the substrate. The fixing unit may be continuously formed along the boundary of the substrate.

The fixing unit may include calcium oxide (CaO) or calcium sulfate ($CaSO_4$).

Bonding the substrate onto the porous carrier substrate may include subjecting the fixing unit to a heat treatment. Removing the substrate from the porous carrier substrate includes reacting the fixing unit with water, hydrochloric acid, or sulfuric acid to remove the fixing unit.

The fixing unit may include silicon, alumina, zirconia, or sodium silicate.

The porous carrier substrate may include a porous ceramic. The porous ceramic may be an alumina-based ceramic material.

The method according to the present embodiment may further include performing the heat treatment on the substrate or the porous carrier substrate.

A temperature of the substrate or the porous carrier substrate during the heat treatment may be about 300° C. or above.

Embodiments are also directed to a method of manufacturing a flexible display apparatus, the method including forming a bonding layer on a porous carrier substrate; bonding a substrate onto the bonding layer; forming a light-emitting display unit on the substrate; forming an encapsulating layer on the light-emitting display unit; and removing the porous carrier substrate.

The bonding layer may be formed on an entire surface of the porous carrier substrate.

The bonding layer may include calcium oxide (CaO) or calcium sulfate ($CaSO_4$).

The bonding layer may be fixed on the porous substrate by subjecting the bonding layer to a heat treatment. The porous carrier substrate is removed by reacting the bonding layer with water, hydrochloric acid, or sulfuric acid.

The bonding layer may include silicon, alumina, zirconia, or sodium silicate.

The porous carrier substrate may include a porous ceramic.

The porous ceramic may be an alumina-based ceramic material.

The method according to the present embodiment may further include performing the heat treatment on the substrate or the porous carrier substrate.

A temperature of the substrate or the porous carrier substrate during the heat treatment may be about 300° C. or above.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Hereinafter, preferable embodiments will be described in detail with reference to the attached drawings.

Figure 1:
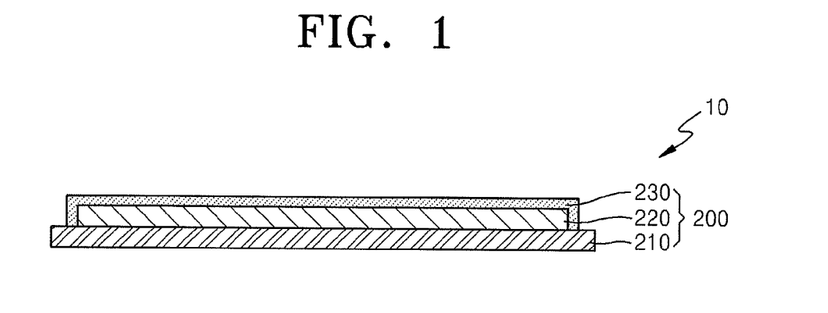
FIG. 1 illustrates a cross-sectional view depicting a flexible display apparatus that may be manufactured using a method of manufacturing the flexible display apparatus according to an embodiment.
Figure 2:
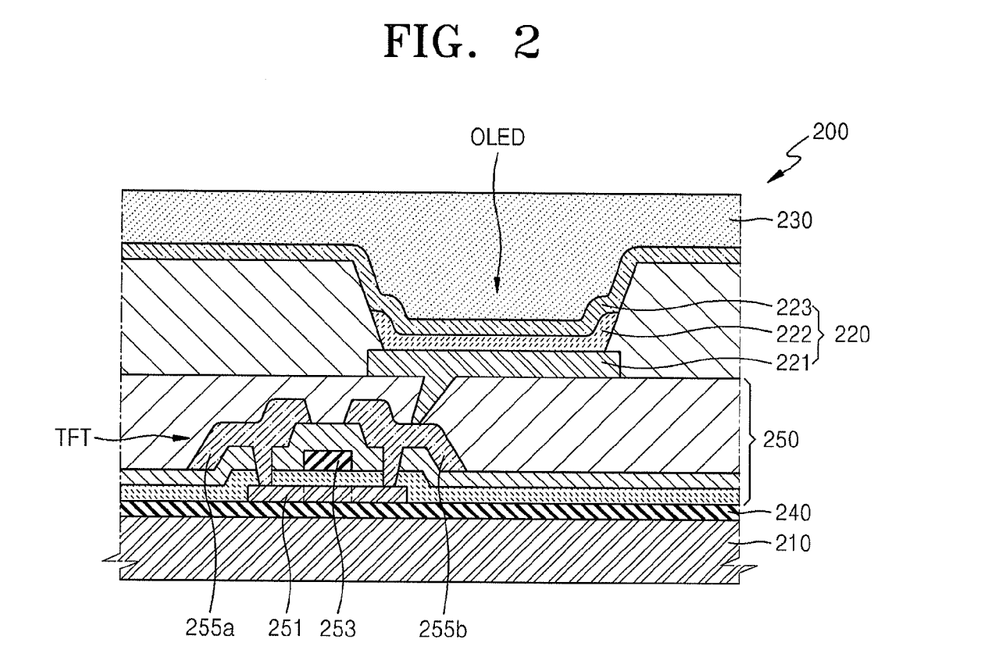
FIG. 2 illustrates a cross-sectional view depicting a pixel region of a display panel unit of the flexible display apparatus of FIG. 1.

FIG. 1 illustrates a cross-sectional view depicting a flexible display apparatus 10 that may be manufactured using a method of manufacturing the flexible display apparatus according to an embodiment. FIG. 2 depicts a cross-sectional view of a pixel region of a display panel unit 200 of the flexible display apparatus 10 of FIG. 1.

Referring to FIGS. 1 and 2, the flexible display apparatus 10 according to an embodiment may include the display panel unit 200.

The display panel unit 200 may be flexible and may be folded or rolled. Thus, the display unit may be convenient for storing and carrying. The display panel unit 200 may be an organic light-emitting display panel or a liquid crystal display panel, as examples. FIG. 2 illustrates an organic light-emitting display panel as an example of the display panel unit 200.

Referring to FIG. 2, the display panel unit 200 may include a substrate 210, a light-emitting display unit 220, which is provided on a first surface of the substrate 210, and an encapsulating layer 230, which is provided on the light-emitting unit 220 to face the substrate 210 and encapsulates the light-emitting display unit 220. Also, a barrier layer 240 and a device/wiring layer 250 may be provided between the substrate 210 and the light-emitting display unit 220.

To make the flexible display panel unit 200 flexible, the substrate 210 may be formed of a plastic material, such as acryl, polyethylene tererphthalate, polyethylene naphthalate, polycarbonate, polyallylate, polyetherimide, polyethersulfone, polyester, Mylar, or polyimide. In other implementations, other flexible materials may be used.

The barrier layer 240 may be provided on the substrate 210. The barrier layer 240 may prevent or hinder external impurities such as moisture or oxygen from passing through the substrate 210 and penetrating into a driving thin film transistor (TFT) and/or the light-emitting display unit 220.

The device/wiring layer 250 may be provided on the barrier layer 240. The device/wiring layer 250 may include the driving TFT, a switching TFT (not shown), a capacitor, and wires (not shown) connected to the driving TFT or the capacitor.

The driving TFT may include an active layer 251, a gate electrode 253, and source and drain electrodes 255a and 255b.

The light-emitting display unit 220 is provided on the device/wiring layer 250. The light-emitting display unit 220 may include a pixel electrode 221, an organic light-emitting layer 222 provided on the pixel electrode 221, and an opposite electrode 223 formed on the organic light-emitting layer 222.

According to the present embodiment, the pixel electrode 221 is an anode, and the opposite electrode 223 may be a cathode. In other implementations, according to methods of operating the display panel unit 200, the pixel electrode 221 may be a cathode, and the opposite electrode 223 may be an anode. Holes and electrons are injected from the pixel and opposite electrodes 221 and 223, respectively, into the organic light-emitting layer 222. The injected holes and electrons combine to form an exciton. Then, the exciton falls from an excited state to a ground state and generates light.

The pixel electrode 221 may be electrically connected to the driving TFT formed in the device/barrier layer 250.

According to the present embodiment, the light-emitting display unit 220 is provided on the device/wiring layer 250 in which the driving TFT is formed. In other implementations, the light-emitting display unit 220 may be provided in various configurations. For example, the pixel electrode 221 of the light-emitting display unit 220 may be formed on the same layer as the active layer 251 of the driving TFT, or, the pixel electrode 221 may be formed on the same layer as the gate electrode 253, or, the pixel electrode 221 may be formed on the same layer as the source and drain electrodes 255a and 255b.

In the driving TFT according to the present embodiment, the gate electrode 253 is provided on the active layer 251. In other implementations, the gate electrode 253 may be provided below the active layer 251.

The pixel electrode 221 provided in the light-emitting display unit 220 according to the present embodiment may be a reflective electrode, and may include a reflecting layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof. A transparent or semitransparent electrode layer may be formed on the reflecting layer.

The transparent or semitransparent electrode layer may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 223 is provided to face the pixel electrode 221. The opposite electrode 231 may be a transparent or semitransparent electrode, and may be formed of a metal thin film having a low work function, such as lithium (Li), calcium (Ca), LiF/Ca, LiF/Al, Al, Ag, Mg, or a compound thereof. Also, an auxiliary electrode layer or a bus electrode may be further formed on the metal thin film by using a material for forming a transparent electrode such as ITO, IZO, ZnO, or $In_2O_3$. Therefore, the opposite electrode 223 may transmit light emitted from the organic light-emitting layer 222.

The organic light-emitting layer 222 is provided between the pixel and opposite electrodes 221 and 223. The organic light-emitting layer 222 may be formed of a low molecular weight organic material or a high molecular weight organic material.

In addition to the organic light-emitting layer 222, an intermediate layer such as a hole transport layer (HTL), a hole injection layer (HIL), an electron transport layer (ETL), or an electron injection layer (EIL) may be selectively provided between the pixel and opposite electrodes 221 and 223.

Light emitted from the organic light-emitting layer 222 may be directly directed toward the opposite electrode 223 or may be reflected by the pixel electrode 221, which is a reflective electrode, toward the opposite electrode 223. Thus, the display panel unit 200 may be a top-emission type.

However, in other implementations, the display panel unit 200 may be a bottom-emission type in which the light emitted from the organic light-emitting layer 222 is emitted toward the substrate 210. In this case, the pixel electrode 231 may be a transparent or semitransparent electrode, and the opposite electrode 233 may be a reflective electrode.

The encapsulating layer 230 may be formed on the opposite electrode 223. The encapsulating layer 230 may be a thin film including a plurality of inorganic layers, or a thin film including inorganic and organic layers. The encapsulating layer 230 may protect the light-emitting display unit 220 from external moisture, oxygen, and the like.

FIGS. 3 to 8 illustrate stages of a method of manufacturing the flexible display apparatus 10 according to an embodiment, and the method of manufacturing the flexible display apparatus 10 according to the embodiment will be described with reference to FIGS. 3 to 8.

Figure 3:
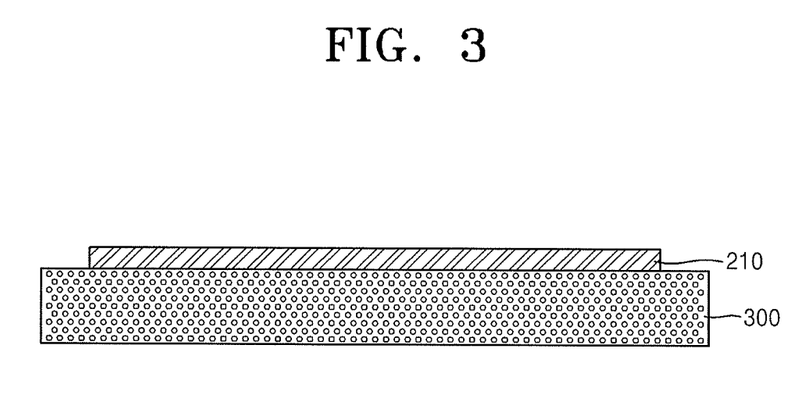
FIGS. 3 to 8 illustrate stages of a method of manufacturing the flexible display apparatus according to an embodiment.

As illustrated in FIG. 3, the substrate 210 may be laminated onto a porous carrier substrate 300.

The substrate 210 may be formed of a plastic material such as acryl, polyethylene tererphthalate, polyethylene naphthalate, polycarbonate, polyalyllate, polyetherimide, polyethersulfone, polyester, Mylar, or polyimide.

The porous carrier substrate 300 may be formed of a material that may endure high temperatures. Also, the porous carrier substrate 300 may be formed of a material that has a sufficient mechanical strength so as to not be deformed even when various devices or layers are formed on the material.

The porous carrier substrate 300 may include a porous ceramic. The porous ceramic may be formed by mixing a ceramic aggregate, in which particle size distribution is controlled to a certain width, with a certain amount of flux, forming the mixture into a certain shape, and heating the mixture at high temperature. The term "porous ceramic" refers to a ceramic having evenly distributed small pores thereon. The porosity of the porous carrier substrate 300 may range from about 30% to about 50% For example, the porosity may be about 45%. The pore size may preferably range from about 5 μm to about 22 μm. For example, the pore size may be about 16 μm. The porous carrier substrate 300 may include an alumina-based ceramic material.

A thickness of the porous carrier substrate 300 may range from about 3 mm to about 4 mm. An air entry value of the porous carrier substrate 300, namely, the pressure at which air breaks through the pores of a fully saturated ceramic, may range from about 1 bar to about 15 bars.

The porous carrier substrate 300 is formed of a porous material. Accordingly, a generation of bubbles between the porous carrier substrate 300 and the substrate 210 may be prevented or reduced.

The porous carrier substrate 300 and the substrate 210 may be laminated at a temperature in a range from about 20° C. to about 80° C., or, for example, at about 25° C.

Figure 4:
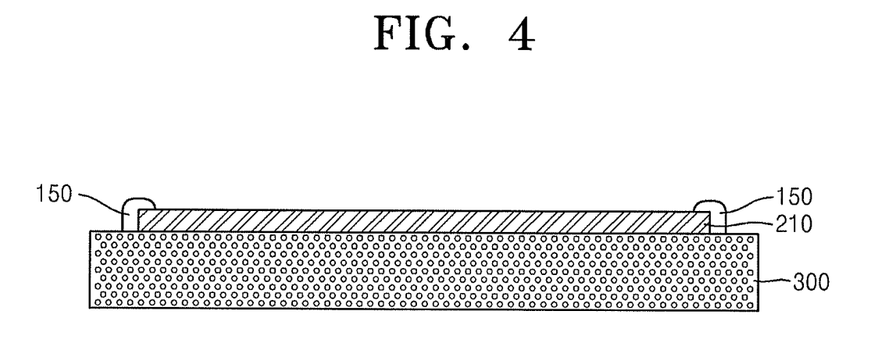

Then, as illustrated in FIG. 4, a fixing unit 150 may be formed. The fixing unit 150 may fix the substrate 210 on the porous carrier substrate 300. The fixing unit 150 may include CaO, CaSO$_4$, silicon, alumina, zirconia, or sodium silicate.

If the fixing unit 150 is formed of CaSO$_4$, first, CaSO$_4$ is mixed with water to form a suspension, and then, a heat treatment is performed on the suspension.

[Chemical Reaction Formaula 1]

According to Chemical Reaction Formula 1, CaSO$_4$*2H$_2$O, that is, a gypsum slurry, loses crystalline water, and is converted into a solidified gypsum. Thus, the substrate 210 may be fixed onto the porous carrier substrate 300 using the solidified gypsum.

If the fixing unit 150 is formed using CaO, first, CaO is mixed with water, and then, a heat treatment is performed on a result of the mixing.

[Chemical Reaction Formula 2]

According to the Chemical Reaction Formula 2, CaO is converted into CaCO$_3$. Then, the substrate 210 may be fixed onto the porous carrier substrate 300 using a solidified CaCO$_3$.

Figure 5A:
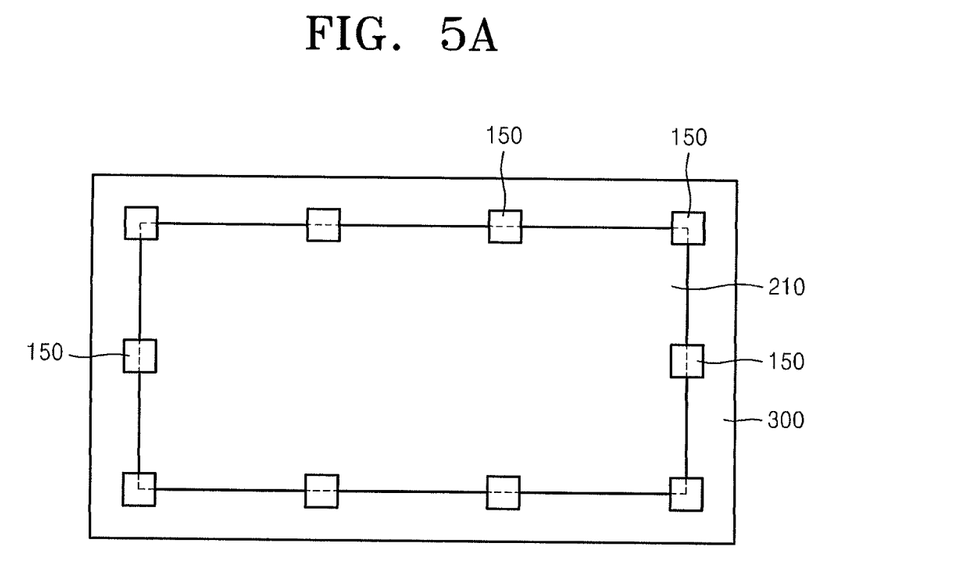
Figure 5B:
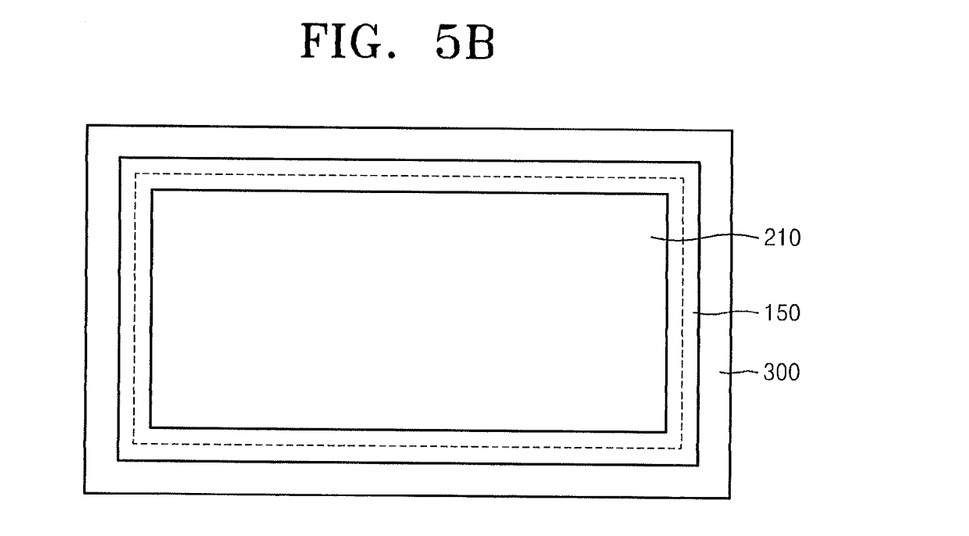

FIGS. 5A and 5B illustrate various exemplary forms of the fixing unit 150.

The fixing unit 150 may be formed over the porous carrier substrate 300 and substrate 210.

Referring to FIG. 5A, the fixing unit 150 may be partially formed along the boundary of the substrate 210. The fixing unit 150 in this implementation fixes a portion of the substrate 210. Accordingly, the substrate 210 may be fixed to the porous carrier substrate 300 using a relatively small amount of the fixing unit 150.

Referring to FIG. 5B, the fixing unit 210 may be continuously formed along the boundary of the substrate 210. The fixing unit 150 in this implementation surrounds and fixes the entire boundary of the substrate 210. Accordingly, the substrate 210 may be securely fixed to the porous carrier substrate 300.

Figure 6:
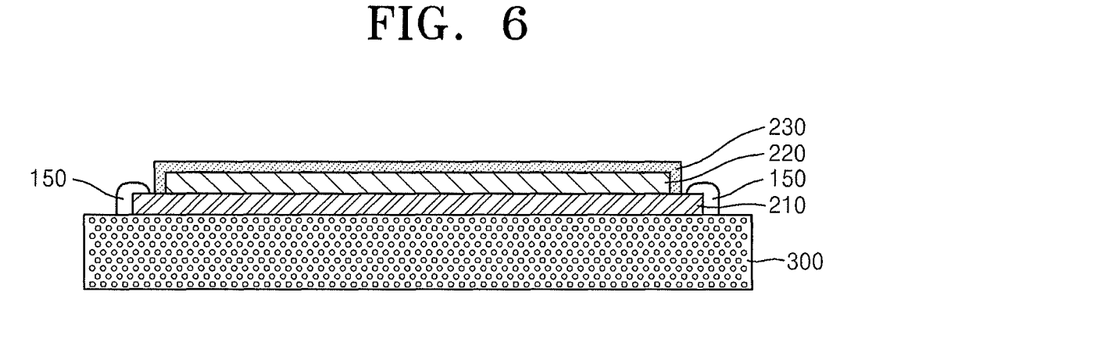

As illustrated in FIG. 6, the light-emitting display unit 220 and the encapsulating layer 230 may be sequentially formed on the substrate 210.

The pixel electrode 221, the organic light-emitting layer 222, and the opposite layer 223 may be sequentially formed on the substrate 210 to form the light-emitting display unit 220. The encapsulating layer 230 may be formed to encapsulate the light-emitting display unit 220. The encapsulating layer 230 may be a thin film including a plurality of inorganic layers, or a thin film including inorganic and organic layers.

During the process of sequentially forming the light-emitting display unit 220 and the encapsulating layer 230 on the substrate 210, a heat treatment may be performed on the substrate 210 or the porous carrier substrate 300. Due to the heat treatment process, a temperature of the substrate 210 or the porous carrier substrate 300 may increase to 300° C. or above. If a material other than the porous carrier substrate were to be used, when a temperature of a substrate or a carrier substrate increases to 300° C. or above, the substrate and carrier substrate could be permanently laminated. According to the present embodiment, the porous carrier substrate 300 is formed of a porous material. Accordingly, even if the temperature of the substrate 210 or the porous carrier substrate 300 increases to 300° C. or above, the substrate 210 and the porous carrier substrate 300 is not permanently laminated.

Figure 7:
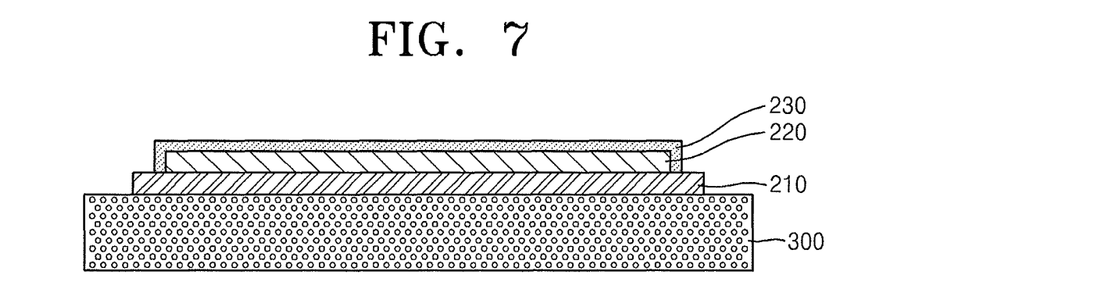

As illustrated in FIG. 7, the fixing unit 150 may be removed. The fixing unit 150 may be removed using a mechanical, physical, or chemical method.

If the fixing unit 150 is formed of CaSO$_4$, when the porous carrier substrate 300 is soaked in water, the water may pass through the porous carrier substrate 300 and contact the fixing unit 150 due to a capillary force. Then, CaSO$_4$ may react with water and thus, the fixing unit 150 may be removed.

[Chemical Reaction Formula 3]

According to Chemical Reaction Formula 3, CaSO$_4$ reacts with water and turns into CaSO$_4$*2H$_2$O, that is, into a gypsum slurry. The gypsum slurry is not solid, and thus may be removed easily.

If the fixing unit 150 is formed of CaO, when the porous carrier substrate 300 is soaked in diluted hydrochloric, the diluted hydrochloric may pass through and contact the fixing unit 150 due to a capillary force. Then, $CaCO_3$ may react with hydrochloric acid and thus, the fixing unit 150 may be removed.

$$CaCO3+2HCl \rightarrow CaCl2+H2O+CO2 \quad \text{[Chemical Reaction Formula 4]}$$

According to Chemical Reaction Formula 4, $CaCO_3$ reacts with HCl and turns into $CaCl_2$. Then, the $CaCl_2$ dissolves in water and thus the fixing unit 150 may be removed.

Figure 8:
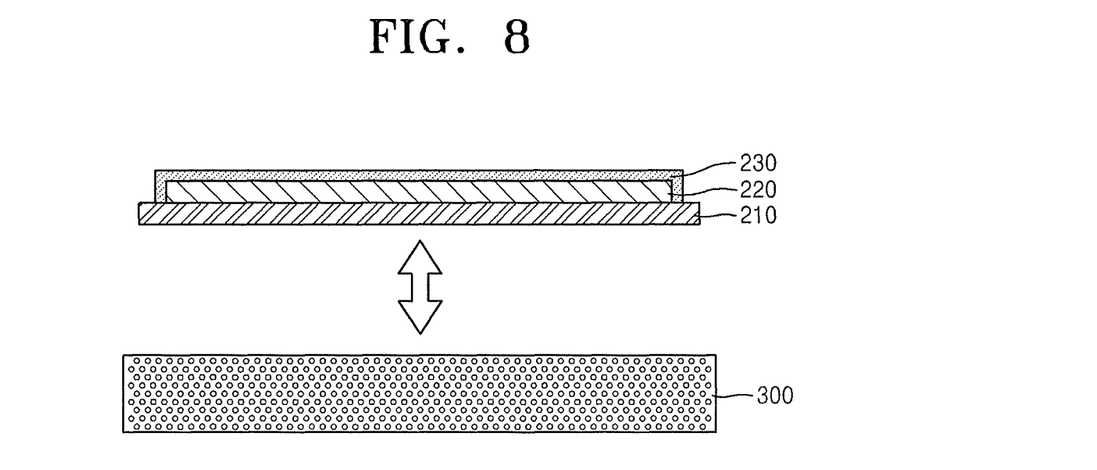

As illustrated in FIG. 8, the substrate 210 may be separated from the porous carrier substrate 300.

The porous carrier substrate 300 may be separated from the substrate 210 using a physical method.

The porous carrier substrate 300 is formed of a porous material. Accordingly, the porous carrier substrate 300 may be easily separated from the substrate 210 without unnecessarily permanently laminating the substrate 210 and the porous carrier substrate 300.

FIGS. 9 to 13 illustrate a method of manufacturing the flexible display apparatus 10 according to another embodiment.

Hereinafter, the present embodiment will be described by focusing on the differences between the present embodiment and the embodiment of FIGS. 3 to 8. Like reference numerals in the drawings denote like elements.

Figure 9:
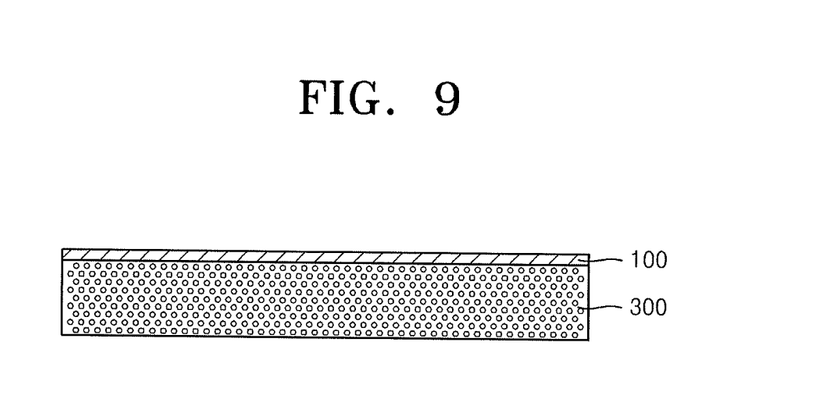
FIGS. 9 to 13 illustrate stages of a method of manufacturing the flexible display apparatus according to another embodiment.

First, as illustrated in FIG. 9, a bonding layer 100 is formed on the carrier substrate 300.

The bonding layer 100 fixes the substrate 210 onto the upper surface of the porous carrier substrate 300. The bonding layer 100 may include CaO, $CaSO_4$, silicon, alumina, zirconia, or sodium silicate.

The bonding layer 100 may be formed to cover the entire surface of the porous carrier substrate 300. Accordingly, the substrate 210 may be fixed more securely to the porous carrier substrate 300, and the substrate 210 may be prevented from contacting the porous carrier substrate 300.

Figure 10:
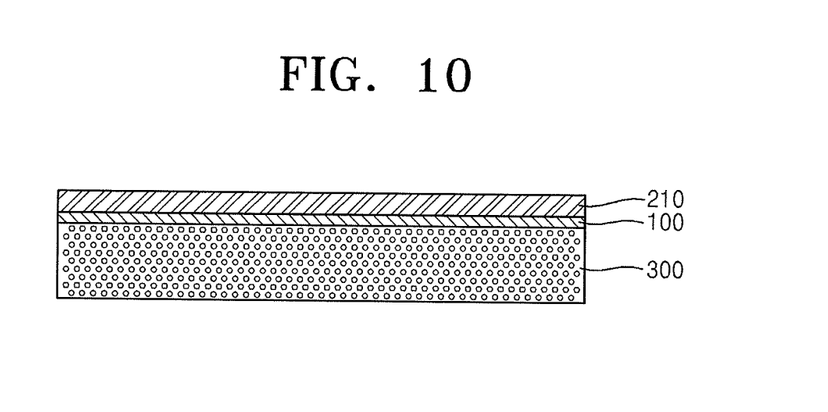

As illustrated in FIG. 10, the substrate 210 may be bonded onto the bonding layer 100.

If the bonding layer 100 is formed of CaO or $CaSO_4$, a heat treatment may be performed on the bonding layer 100, and thus, the bonding layer 100 may be solidified. When the bonding layer 100 is solidified, the substrate 210 may be bonded on the bonding layer 100. Therefore, the substrate 210 may be fixed to the upper surface of the porous carrier substrate 300.

Figure 11:
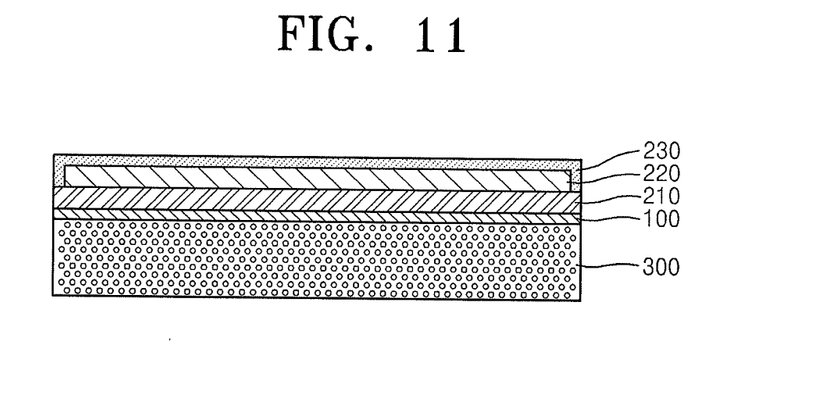

As illustrated in FIG. 11, the light-emitting display unit 220 and the encapsulating layer 230 may be sequentially formed on the substrate 210.

During the process of sequentially forming the light-emitting display unit 220 and the encapsulating layer 230 on the substrate 210, a heat treatment may be performed on the substrate 210 or the porous carrier substrate 300. Due to the heat treatment process, a temperature of the substrate 210 or the porous carrier substrate 300 may increase to 300° C. or above. If a material other than the porous carrier substrate were to be used, when a temperature of a substrate or a carrier substrate increases up to 300° C. or above, the substrate and carrier substrate could be permanently laminated. According to the present embodiment, the bonding layer 100 is formed between the substrate 210 and the porous carrier substrate 300. Accordingly, even if the temperature of the substrate 210 or the porous carrier substrate 300 increases to 300° C. or above, the substrate 210 and the porous carrier substrate 300 are not permanently laminated.

Figure 12:
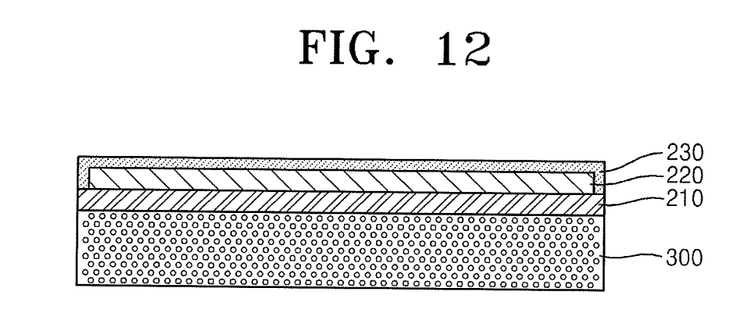

As illustrated in FIG. 12, the bonding layer 100 is removed. The bonding layer 100 may be removed using a mechanical, physical, or chemical method.

If the bonding layer 100 is formed of CaO or $CaSO_4$, water, hydrochloric acid, or sulfuric acid may be provided to react with the bonding layer 100, and thus, the bonding layer 100 may be removed. The solidified bonding layer 100 may react to water, hydrochloric acid, or sulfuric acid and be liquidified, and thus, the bonding layer 100 may be easily removed.

Figure 13:
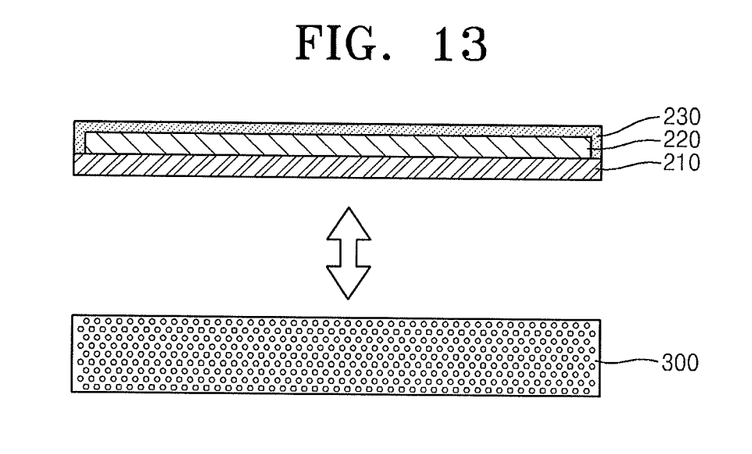

As illustrated in FIG. 13, the substrate 210 may be separated from the porous carrier substrate 300. As an example, the substrate 210 may be separated from the porous carrier substrate as a result of removing the bonding layer 100, and the removing the bonding layer 100 and separating the substrate 210 from the porous carrier substrate 300 may occur at the same time.

The porous carrier substrate 300 may be separated from the substrate 210 using a physical method.

The porous carrier substrate 300 is formed of a porous material and the bonding layer 100 is formed and removed. Accordingly, the porous carrier substrate 300 may be easily separated from the substrate 210 without unnecessarily permanently laminating the substrate 210 and the porous carrier substrate 300.

By way of summation and review, organic light-emitting display panels may be embodied as flexible display panels using a plastic substrate. In general, flexible organic light-emitting display panels may be formed by forming an organic light-emitting device, and the like on a carrier substrate formed of a material such as glass, and then removing the carrier substrate from a plastic substrate. However, when such a material is used as the carrier substrate, when a temperature of a substrate or a carrier substrate increases to 300° C. or above, there is a possibility the substrate and carrier substrate may be difficult to separate.

In contrast, embodiments provide a method of manufacturing a flexible display apparatus in which a substrate and a carrier substrate may be easily separated.

According to an embodiment, a substrate and a carrier substrate may not be permanently laminated by using a porous carrier substrate, and bubbles may not be generated between the substrate and the carrier substrate.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. A method of manufacturing a flexible display apparatus, the method comprising:
   bonding a substrate onto a porous carrier substrate;
   forming a fixing unit over the porous carrier substrate and the substrate that fixes the substrate onto the porous carrier substrate;
   forming a light-emitting display unit on the substrate;
   forming an encapsulating layer on the light-emitting display unit; and
   removing the porous carrier substrate.

2. The method as claimed in claim 1, further comprising forming a fixing unit that fixes the substrate onto the porous carrier substrate, wherein the fixing unit is partially formed along a boundary of the substrate.

3. The method as claimed in claim 1, further comprising forming a fixing unit that fixes the substrate onto the porous carrier substrate, wherein the fixing unit is continuously formed only along a boundary of the substrate.

4. The method as claimed in claim 1, wherein the fixing unit includes calcium oxide (CaO) or calcium sulfate ($CaSO_4$).

5. The method as claimed in claim 1, further comprising forming a fixing unit that fixes the substrate onto the porous carrier substrate, wherein:
the fixing unit includes calcium oxide (CaO) or calcium sulfate ($CaSO_4$),
bonding the substrate onto the porous carrier substrate includes subjecting the fixing unit to a heat treatment, and
removing the substrate from the porous carrier substrate includes reacting the fixing unit with water, hydrochloric acid, or sulfuric acid to remove the fixing unit.

6. The method as claimed in claim 1, wherein the fixing unit includes silicon, alumina, zirconia, or sodium silicate.

7. The method as claimed in claim 1, wherein the porous carrier substrate includes a porous ceramic.

8. The method as claimed in claim 7, wherein the porous ceramic is an alumina-based ceramic material.

9. The method as claimed in claim 1, further comprising performing a heat treatment on the substrate or the porous carrier substrate.

10. The method as claimed in claim 9, wherein a temperature of the substrate or the porous carrier substrate during the heat treatment is about 300° C. or above.

11. The method as claimed in claim 1, wherein a porosity of the porous carrier substrate ranges from about 45% to about 50%.

12. The method as claimed in claim 1, wherein a pore size of the porous carrier substrate ranges from about 5 μm to about 22 μm.

13. The method as claimed in claim 1, wherein the porous carrier substrate prevents or reduces generation of bubbles between the porous carrier substrate and the substrate.

14. A method of manufacturing a flexible display apparatus, the method comprising:
forming a bonding layer on a porous carrier substrate, the bonding layer including calcium oxide (CaO) or calcium sulfate ($CaSO_4$), the bonding layer being fixed on the porous carrier substrate by subjecting the bonding layer to a heat treatment;
bonding a substrate onto the bonding layer;
forming a light-emitting display unit on the substrate;
forming an encapsulating layer on the light-emitting display unit; and
removing the porous carrier substrate by reacting the bonding layer with water, hydrochloric acid, or sulfuric acid.

15. The method as claimed in claim 14, the bonding layer is formed on an entire surface of the porous carrier substrate.

16. The method as claimed in claim 14, wherein the bonding layer includes silicon, alumina, zirconia, or sodium silicate.

17. The method as claimed in claim 14, wherein the porous carrier substrate includes a porous ceramic.

* * * * *